United States Patent
Dimig et al.

[11] Patent Number: 6,058,751
[45] Date of Patent: May 9, 2000

[54] FREE-WHEELING LOCK

[75] Inventors: Steven J. Dimig, Plymouth; Keith D. Zirtzlaff, Port Washington, both of Wis.

[73] Assignee: Strattec Security Corporation, Milwaukee, Wis.

[21] Appl. No.: 09/149,334

[22] Filed: Sep. 8, 1998

[51] Int. Cl.[7] ............................................. E05B 15/00
[52] U.S. Cl. ............................ 70/419; 70/422; 70/379 R
[58] Field of Search ............................ 70/379 R, 379 A, 70/380, 419, 422, 493, 495, 492, 356, 367, 369

[56] References Cited

U.S. PATENT DOCUMENTS

| | | | |
|---|---|---|---|
| 2,016,602 | 10/1935 | Jacobi | 70/46 |
| 2,068,405 | 1/1937 | Gerald | 70/46 |
| 2,096,719 | 10/1937 | Johnstone | 70/419 |
| 2,666,322 | 1/1954 | Uher | 70/419 |
| 3,287,944 | 11/1966 | Crumb . | |
| 3,410,123 | 11/1968 | Jacobi . | |
| 3,524,335 | 8/1970 | George . | |
| 3,599,455 | 8/1971 | Pilvet | 70/379 R X |
| 3,637,243 | 1/1972 | Kitano et al. | 287/53 |
| 3,659,444 | 5/1972 | Wellekens | 70/360 |
| 3,739,611 | 6/1973 | Ignatjev | 70/419 X |
| 3,863,476 | 2/1975 | Patriquin | 70/419 |
| 3,928,993 | 12/1975 | Epstein | 70/419 |
| 3,968,668 | 7/1976 | Epstein | 70/379 R X |
| 3,992,907 | 11/1976 | Pilvet | 70/222 |
| 4,385,510 | 5/1983 | Harper | 70/375 X |
| 4,773,240 | 9/1988 | Foshee | 70/222 |
| 4,794,772 | 1/1989 | Falk et al. | 70/491 |
| 4,903,512 | 2/1990 | Leroy et al. | 70/379 R |
| 4,936,895 | 6/1990 | Leclerc et al. | 70/380 |
| 5,044,183 | 9/1991 | Neyret | 70/223 |
| 5,050,410 | 9/1991 | Claar et al. | 70/237 |
| 5,060,494 | 10/1991 | Moorhouse | 70/419 |
| 5,070,716 | 12/1991 | Whorlow | 70/492 |
| 5,216,908 | 6/1993 | Malvy | 70/218 |
| 5,263,348 | 11/1993 | Wittwer | 70/379 R |
| 5,265,453 | 11/1993 | Konii et al. | 70/379 R |
| 5,285,667 | 2/1994 | Fukasawa et al. | 70/379 R |
| 5,295,377 | 3/1994 | Moricz et al. | 70/379 R |
| 5,570,599 | 11/1996 | Konii | 70/186 |
| 5,577,409 | 11/1996 | Oyabu et al. | 70/379 R |
| 5,640,864 | 6/1997 | Miyamoto | 70/379 R |
| 5,704,234 | 1/1998 | Resch | 70/422 X |
| 5,732,580 | 3/1998 | Garnault et al. | 70/379 R X |
| 5,765,417 | 6/1998 | Bolton | 70/422 X |
| 5,775,147 | 7/1998 | Wittwer | 70/379 R |

*Primary Examiner*—Suzanne Dino Barrett
*Attorney, Agent, or Firm*—Reinhart, Boerner, Van Deuren, Norris & Rieselbach, s.c.

[57] ABSTRACT

A free-wheeling lock assembly includes a free-wheeling lock mechanism which prevents damaging forces from being applied to the components of the lock assembly if the lock cylinder is forcibly rotated by a key other than the proper key or by some other instrument. A detent mechanism, which functions independent of spring bias, couples the sleeve to the case in the presence of the proper key in the keyway. A clutch mechanism couples the cylinder to the driver, but decouples the driver from the cylinder for an over-torque condition. The cylinder lock assembly further includes a locking mechanism which prevents operation of the latching mechanism of the lock assembly if the cylinder is slam-pulled from the case. The tumblers are isolated from rotary motion of the tumbler ward.

6 Claims, 15 Drawing Sheets

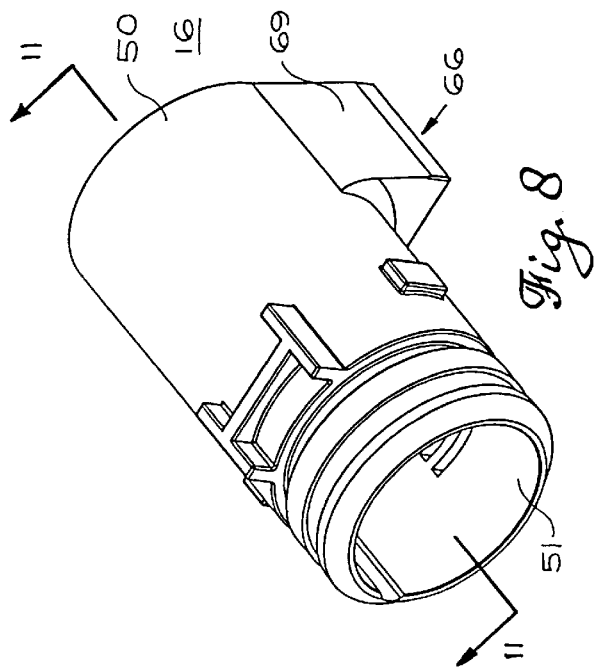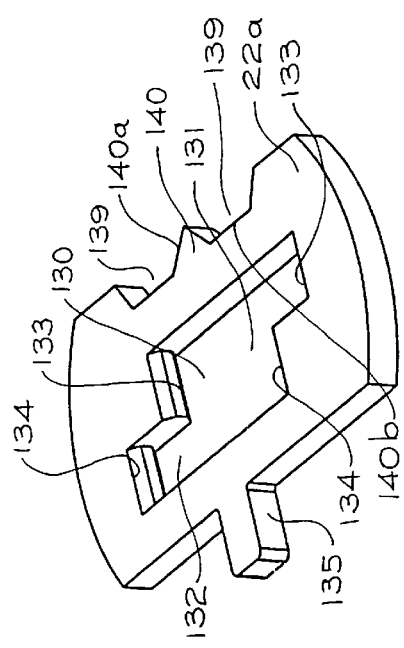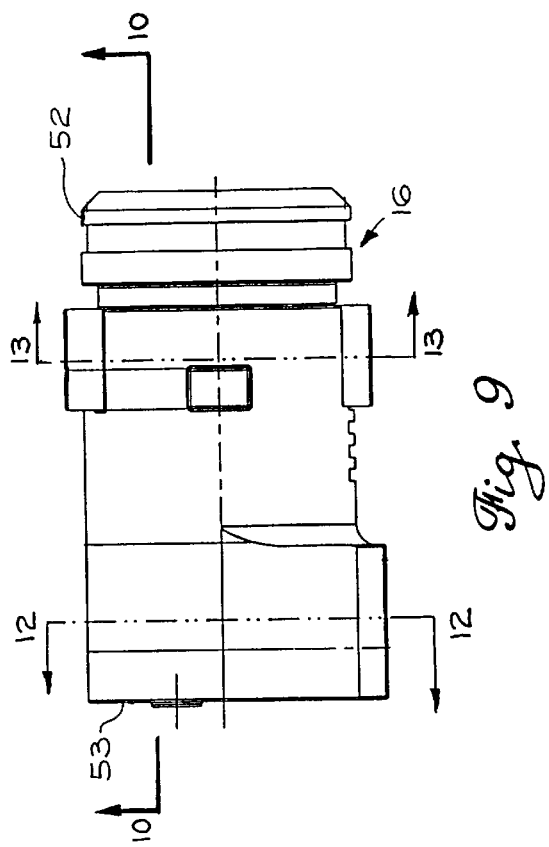

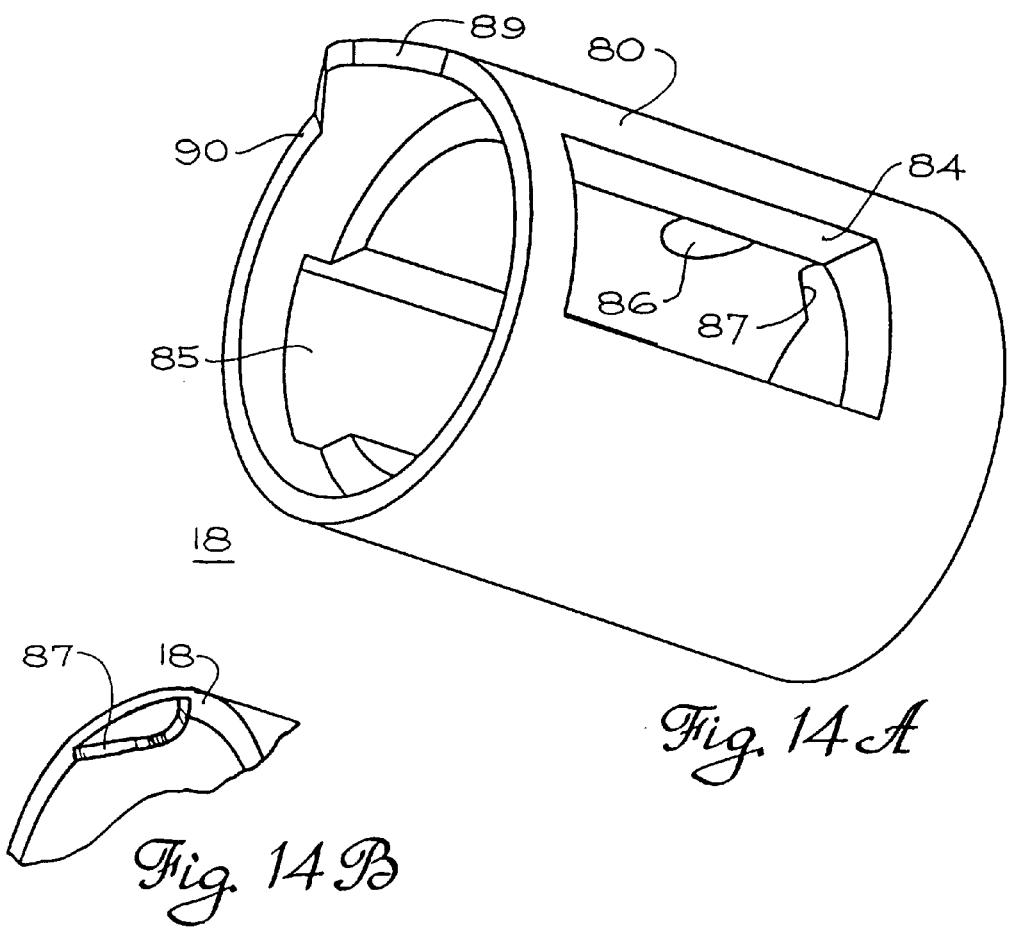
Fig. 14A
Fig. 14B
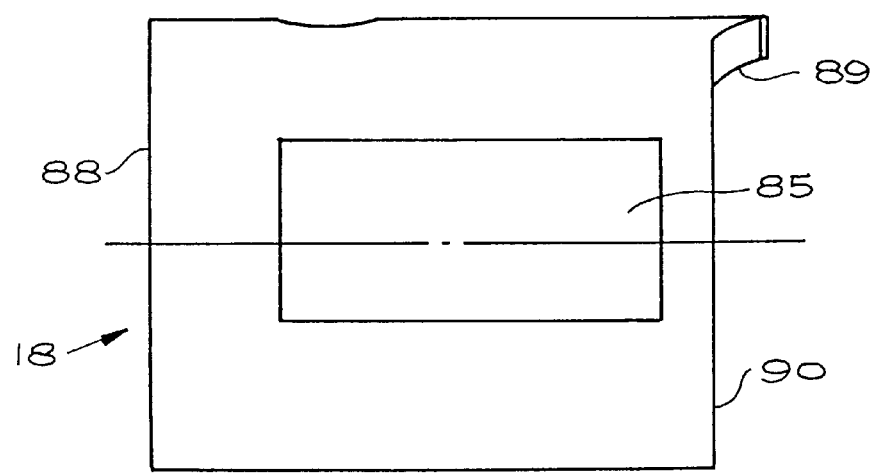
Fig. 15

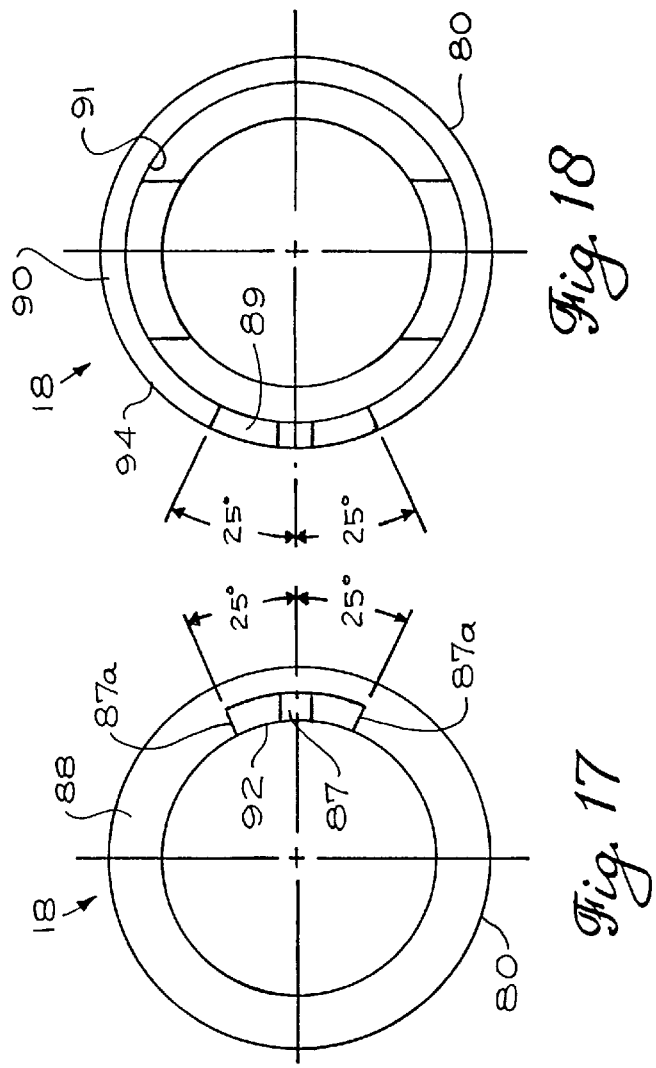
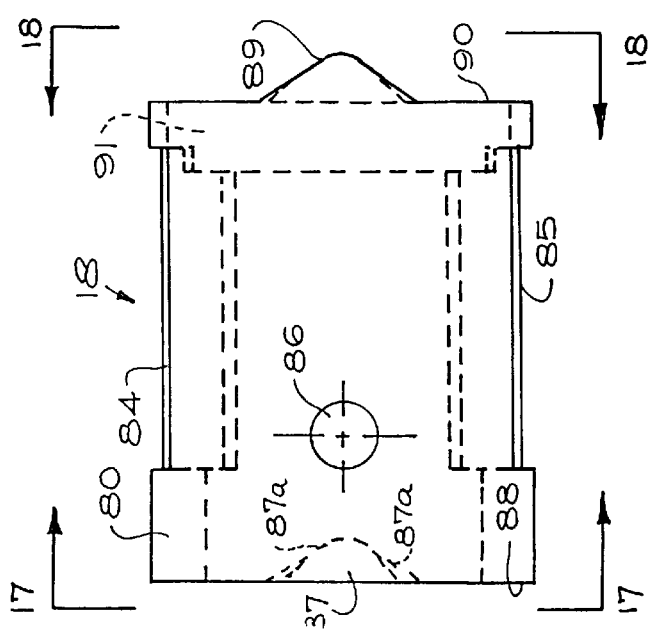

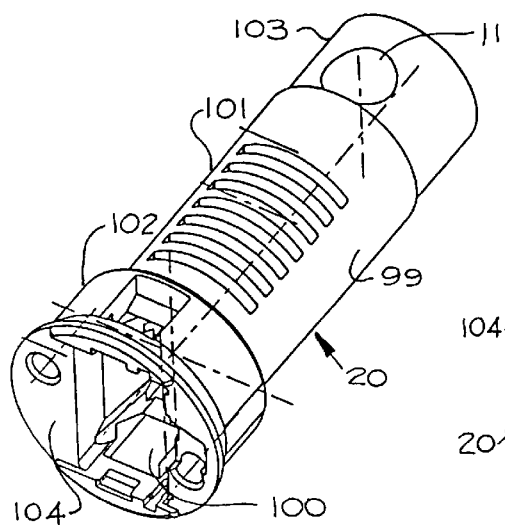
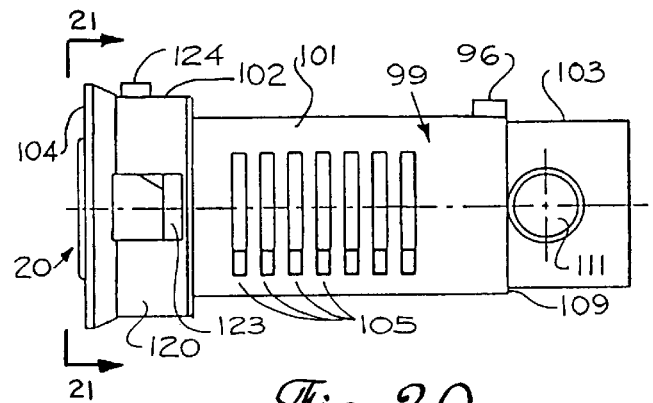
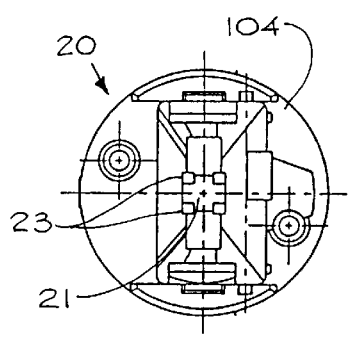
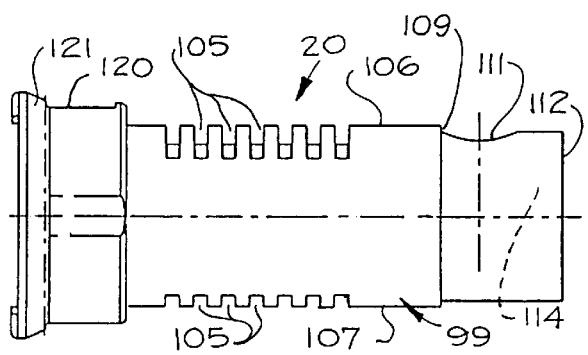
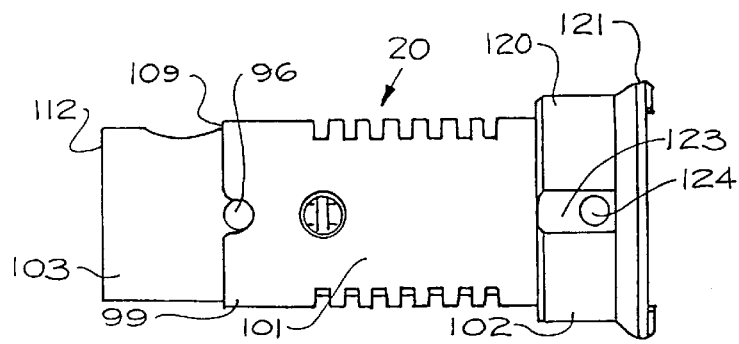

FREE-WHEELING LOCK

BACKGROUND OF THE INVENTION

This invention relates to lock and key sets, and more particularly, to a lock and key set including a tamper resistant, free-wheeling type lock.

The purpose of a free-wheeling type lock is well known in the industry and various designs can be seen in the marketplace. The construction of a free-wheeling type lock prevents the lock from being over-torqued during an attack by allowing the lock cylinder to de-clutch from the driving mechanism of the lock when an improper key, screwdriver or other device is used to turn the lock cylinder. To reset the lock, the cylinder is rotated back to a key-out position where the lock cylinder is again coupled to the driving mechanism. Although many concepts have been explored in the past, most free-wheeling locks have been costly and complicated to produce or have proven to be unreliable. Many designs are bulky in size or require multiple motions of the key, including various push in and turn sequences, to actuate their drive mechanisms.

Typically, free-wheeling type locks include a spring-loaded detent to achieve the clutching action between the moving parts of the lock. However, the use of a spring-actuated motion to move the internal mechanisms results in a non-positive motion that is subject to timing restraints. Some free-wheeling lock designs fail to isolate the tumblers from the rotary motion of the sleeve tumbler ward, making the locks more susceptible to picking. Most locks can be picked when the cylinder is rotated with respect to the sleeve or case tumbler ward. This allows a tumbler to be "loaded" or to contact the edge of the sleeve or case tumbler ward. When the tumblers are held in this manner, the tumblers can be individually picked down out of the ward and rotated forward ever so slightly and be retained in place by the sleeve or case edge until the cylinder rotates freely. Some known free-wheeling locks include a sleeve which rotates with respect to the cylinder but typically have a spring biased detent ball which holds the sleeve in the key-out position. This detent allows enough drag on the sleeve to permit an attacker to load a tumbler and permits picking.

To accommodate the multiple motion key sequences, known free-wheeling locks provide for axial displacement of the cylinder and/or the sleeve. The displacement is usually against the force of a spring bias to allow the cylinder and/or the sleeve to be returned to the key-out position when torque or axial motion on the key is released. However, the requirement for spring bias and additional motion can make the lock complicated to use.

Another consideration is that locks can be compromised by slam-pulling the lock cylinder, out of the case, exposing the driving mechanism. Although slampull preventing designs have been proposed, many have not been successful. Thus, known locks generally do not prevent manipulation of the drive mechanism after a slam-pull attack.

It is, therefore, an object of the invention to provide a new and improved lock and key set.

Another object of the invention is to provide a free-wheeling lock which is pick resistant.

A further object of the invention is to provide a free-wheeling lock which is rendered inoperative if the cylinder is forcibly removed from the lock, such as by being slam-pulled from the case.

Another object of the invention is to provide a free-wheeling lock which does not require multiple motions of the key to actuate the drive mechanism of the lock.

Another object of the invention is to provide a mechanism that will disengage the cylinder from the drive mechanism when subjected to a forced rotation.

Yet another object of the invention is to provide a free-wheeling lock in which the tumblers are isolated from the rotary motion of the sleeve tumbler ward.

Another object of the invention is to provide a free-wheeling lock which is compact in size and requires few components.

SUMMARY OF THE INVENTION

These and other objects are achieved by the present invention which provides a lock and key set which includes a free-wheeling lock assembly which is compact in size and requires few components. According to the invention the lock comprises a case, a sleeve mounted within the case for rotational and axial movement relative to the case, a cylinder mounted within the sleeve for substantially rotational movement relative to the sleeve, and a driver mounted in the case and coupled to a latching mechanism for actuating the latching mechanism. The lock assembly further includes a clutch mechanism releasably coupling the driver to the cylinder for normally coupling the driver to the cylinder.

The lock assembly further includes a detent mechanism which is operable between first and second conditions. In its first condition, the detent mechanism prevents relative rotation between the sleeve and the case by coupling the sleeve to the case. In addition, in its first condition, the detent mechanism allows relative axial movement between the sleeve and case. In its second condition, the detent mechanism decouples the sleeve from the case permitting the sleeve to rotate relative to the case. Under normal conditions, the clutch mechanism couples the driver to the cylinder such that the driver rotates with the cylinder when the cylinder is rotated by a key during unlocking of the lock. However, the clutch mechanism decouples the driver from the cylinder during an over-torque condition, such as when an improper key, or some other instrument, such as a screwdriver, is used to turn the cylinder.

In one embodiment, the detent mechanism includes first and second radially disposed detent members defining a shear line. A tumbler of the lock assembly moves the first and second members radially to position the shear line between juxtaposed peripheral surfaces of the cylinder and the sleeve, allowing the cylinder to rotate relative to the sleeve. Furthermore, the tumbler motion moves the second member radially to engage a detent in the case preventing rotation of the sleeve relative to the case.

In accordance with one preferred embodiment, the sleeve is cam driven axially away from and then back to a key-out position. To this end, the free-wheeling lock assembly includes a translation mechanism including first cam system for driving the sleeve axially to the case in one direction when the cylinder is being rotated by the proper key. A second cam system drives the sleeve axially to the case in the opposite direction when the cylinder is returned to its key-out position. The provision of cam mechanisms rather than spring bias increases the reliability of the free-wheeling lock assembly because the lock assembly does not depend upon the limited forces that are available from the bias springs that are used in known free-wheeling locks.

In accordance with the invention, for a key-out condition, the driver is locked against rotation relative to the case by a locking element which normally locks the driver to the case under key-out conditions. The protection is enhanced against the lock being operated by forced rotation of the cylinder because the over torque condition will result in the driver being decoupled from the cylinder by the clutch mechanism during the over torque condition. When the proper key is inserted into the lock assembly, cam surfaces on the sleeve and the case cause the locking element to be moved forward axially, thereby releasing the driver from the case so that the driver can be rotated by the cylinder.

In one embodiment, the detent mechanism of the free-wheeling lock assembly includes an arrangement which allows the sleeve tumbler ward to be free-floating with respect to the tumblers, so that picking the lock is virtually impossible. In the lock assembly according to the invention, the sleeve which contains the tumbler ward is free to rotate with the cylinder. If an attacker attempts to rotate the cylinder to load up a tumbler, the sleeve freely rotates along with the cylinder so that no load can be placed on the edge of the touching tumbler. In addition, the free-wheeling lock assembly incorporates a latching mechanism that renders the lock assembly inoperative if the cylinder is slam-pulled from the case.

In accordance with a feature of the invention, the free-wheeling lock assembly provided by the invention is operated using a simple, standard key motion to actuate the drive mechanism of the lock assembly. Moreover, the free-wheeling feature is undetectable to the user in normal operation, providing added security without confusing the user.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, wherein like reference numerals identify like elements, and wherein:

FIG. 7 is an isometric view of a tumbler of the free-wheeling lock assembly of FIG. 1;

FIG. 8 is an isometric view showing the top front of a case of the free-wheeling locks assembly of FIG. 1;

FIG. 9 is a side elevation view of the case of FIG. 8;

FIGS. 14A and 14B are isometric views showing the front and back of a sleeve of the free-wheeling lock assembly of FIG. 1;

FIG. 15 is a top plan view of the sleeve of FIG. 14A;

FIG. 16 is a side elevation view of the sleeve of FIG. 14A;

FIG. 17 is a rear elevation view of the sleeve of FIG. 14A, taken in the direction of the arrows 17—17 in FIG. 16;

FIG. 18 is a front elevation view of the sleeve of FIG. 14A, taken in the direction of the arrows 18—18 in FIG. 16;

FIG. 19 is an isometric view showing the front of a cylinder of the free-wheeling lock assembly of FIG. 1;

FIG. 20 is a top plan view of the cylinder of FIG. 19;

FIG. 21 is a front elevation view of the cylinder of FIG. 19, taken in the direction of the arrows 21—21 in FIG. 20;

FIG. 22 is a right side elevation view of the cylinder of FIG. 19;

FIG. 23 is a left side elevation view of the cylinder of FIG. 19;

DETAILED DESCRIPTION OF THE PREFERRED EMBODIMENTS

Figure 1:
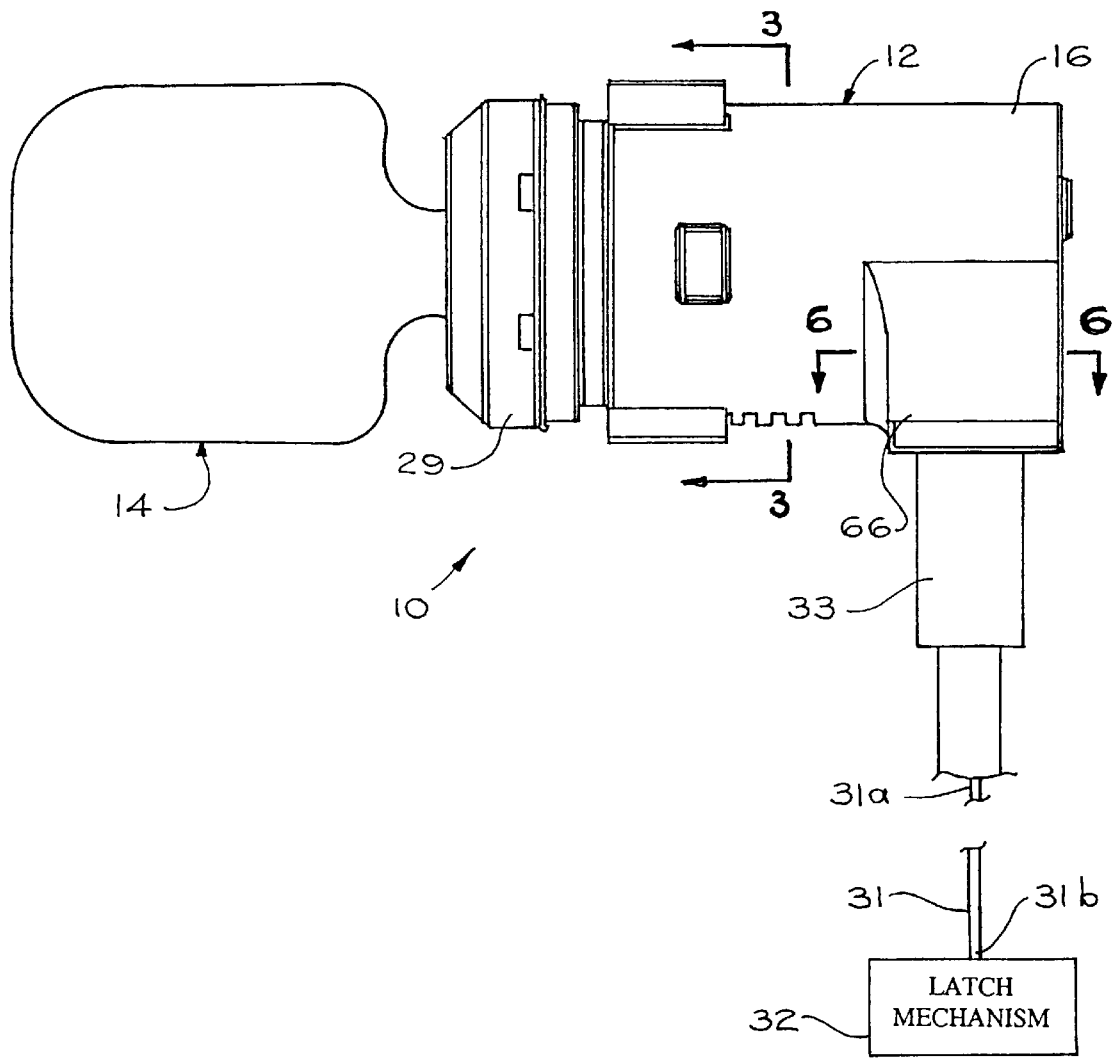
FIG. 1 is a side elevation view of a lock and key set including a free-wheeling lock assembly in accordance with the invention.
Figure 2:
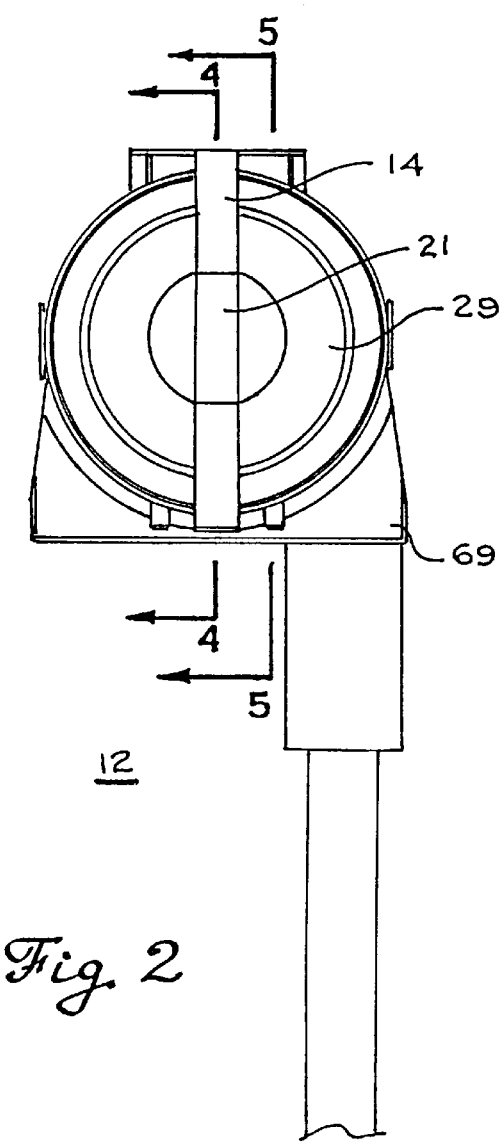
FIG. 2 is a front elevation view of the lock and key set of FIG. 1.

Referring to FIGS. 1–6 of the drawings, there is illustrated one embodiment of a lock and key set 10 provided in accordance with the invention. The lock and key set 10 includes a free-wheeling lock assembly 12 and a key 14. In one embodiment, the lock assembly 12 includes four major components, namely, a case 16, a sleeve 18, a cylinder 20 which includes a plurality of tumblers 22a–22g, and a driver 24.

Figure 3:
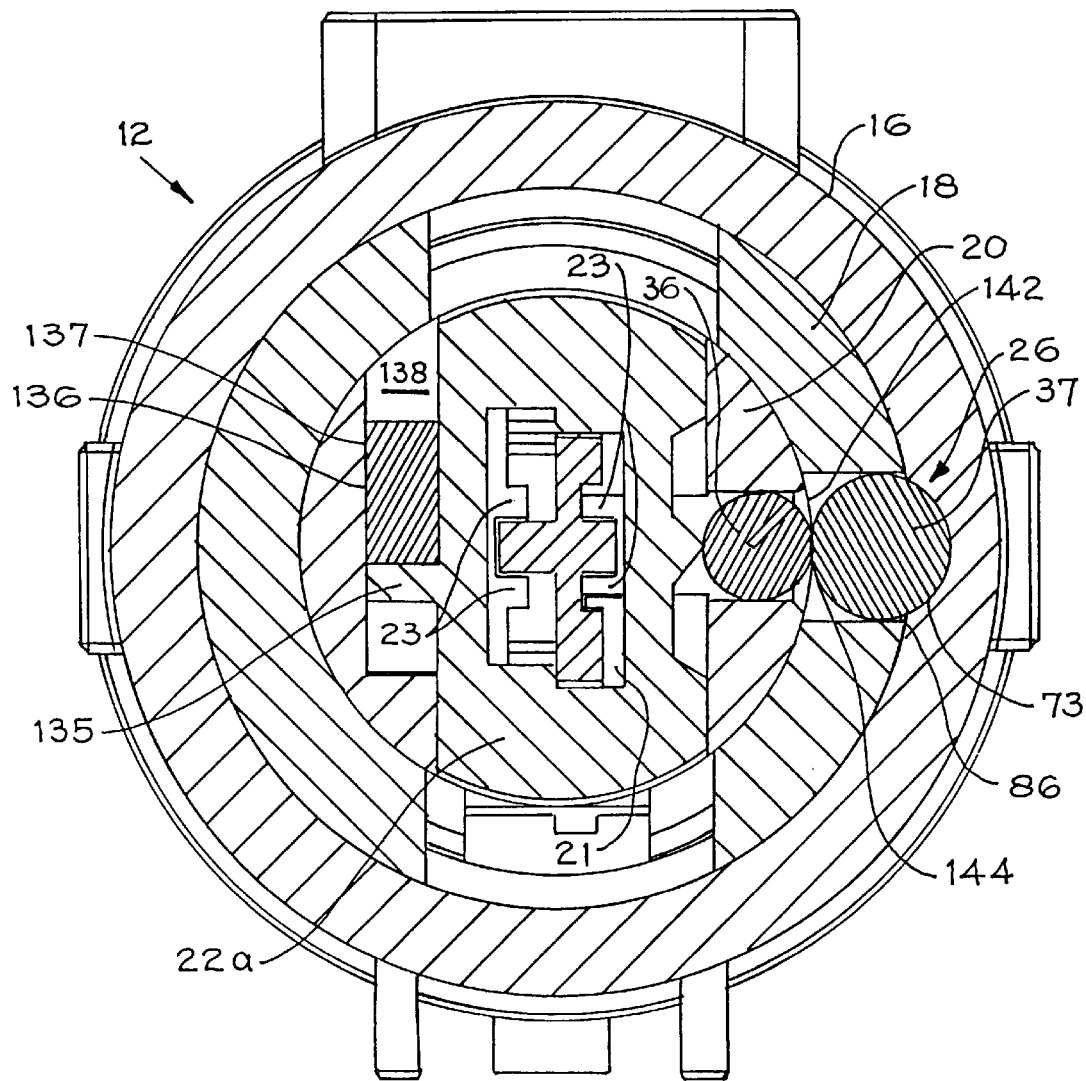
FIG. 3 is a transverse section view of the lock and key set taken along the line 3—3 of FIG. 1.
Figure 4:
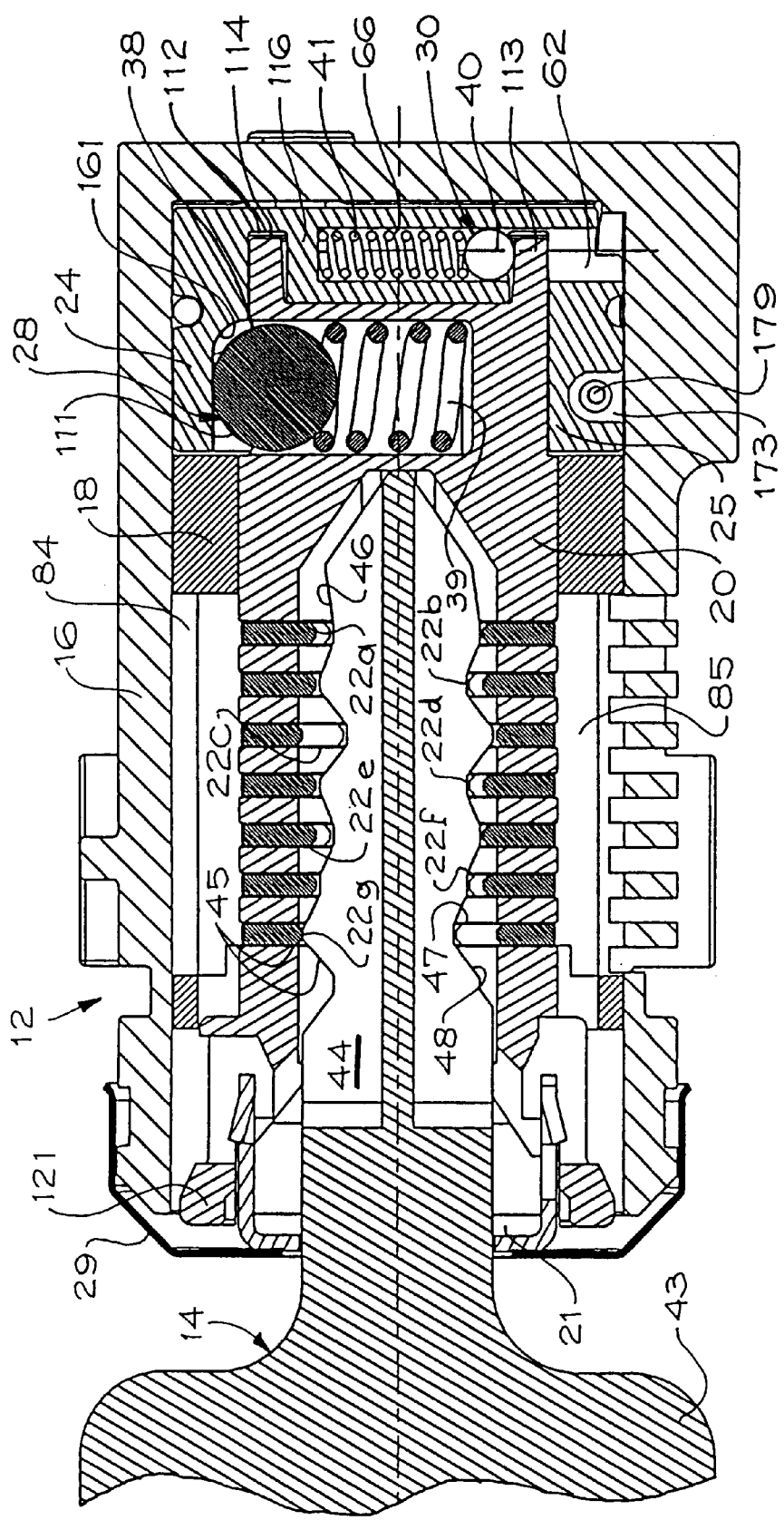
FIG. 4 is a vertical section view of the lock and key set taken along the line 4—4 in FIG. 2.
Figure 5:
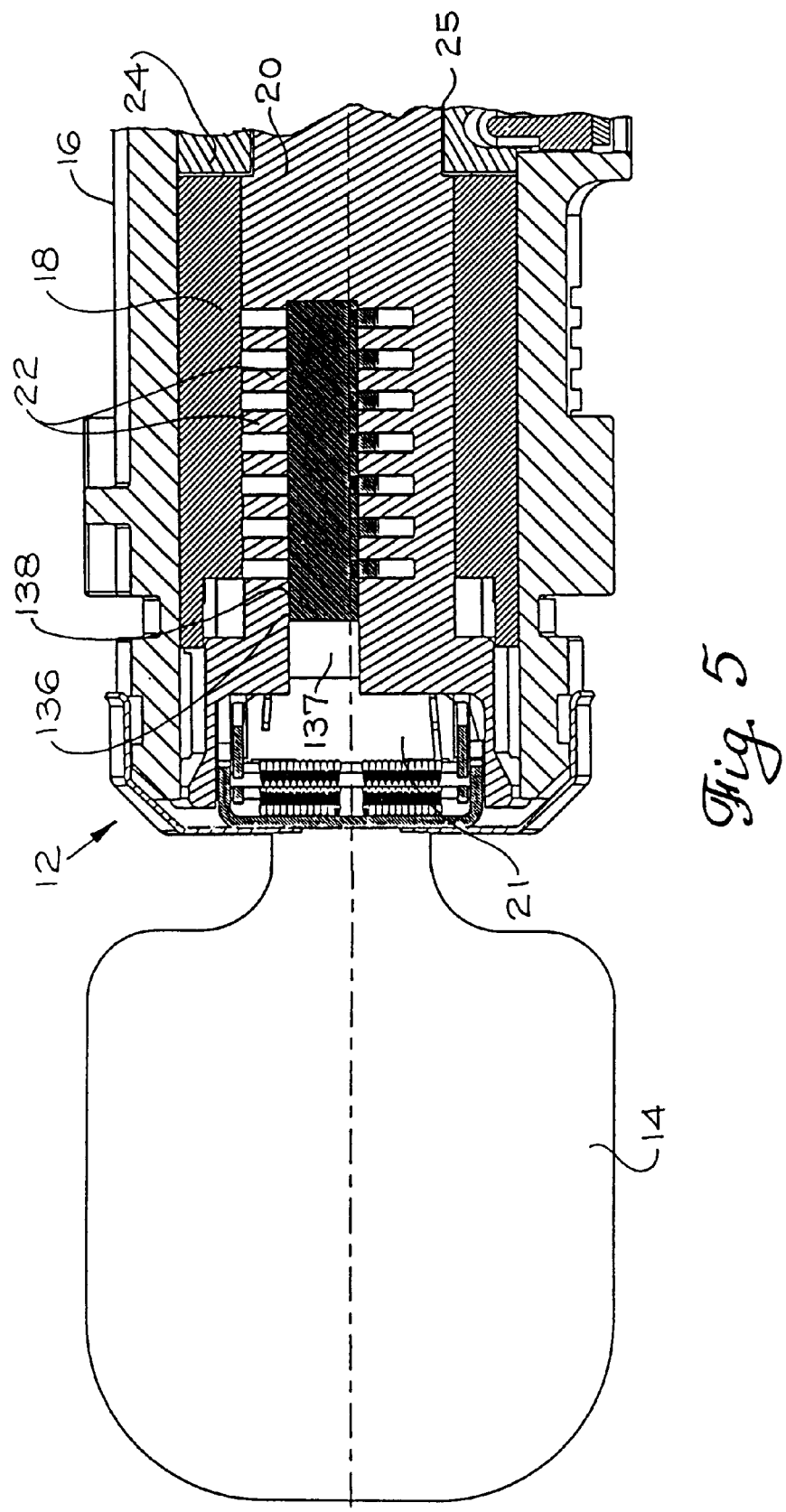
FIG. 5 is a vertical section view of the lock and key set taken along the line 5—5 in FIG.2.

As shown in FIGS. 3 and 4, the sleeve 18 is dimensioned to be mounted within the case 16 and the cylinder 20 is dimensioned to be mounted within the sleeve 18. The sleeve 18 is adapted to be rotated with the cylinder 20 relative to the case 16 when the tumblers 22a–22g couple the sleeve 18 to the cylinder 20 in a key-out condition. However, the sleeve 18 is adapted to be moved axially relative to the cylinder 20 while the cylinder rotates relative to the sleeve when a proper key is in the keyway. The driver 24 is located within the case 16, rearwardly of the sleeve 18 and the cylinder 20. A portion of the cylinder 20 extends into a recessed forward portion 25 of the driver 24. A clutch mechanism 28 releasably couples the cylinder 20 to the driver 24 so that the driver 24 and the cylinder 20 rotate as a unit relative to the case 16. However, for an over torque condition, the clutch mechanism 28 decouples the driver 24 from the cylinder 20, allowing the cylinder 20 to rotate freely while the driver 24 is locked against rotation relative to the case 16. A conventional case cap 29 can be mounted on the front end of the case 16 as shown in FIGS. 1 and 4, for example.

Figure 28:
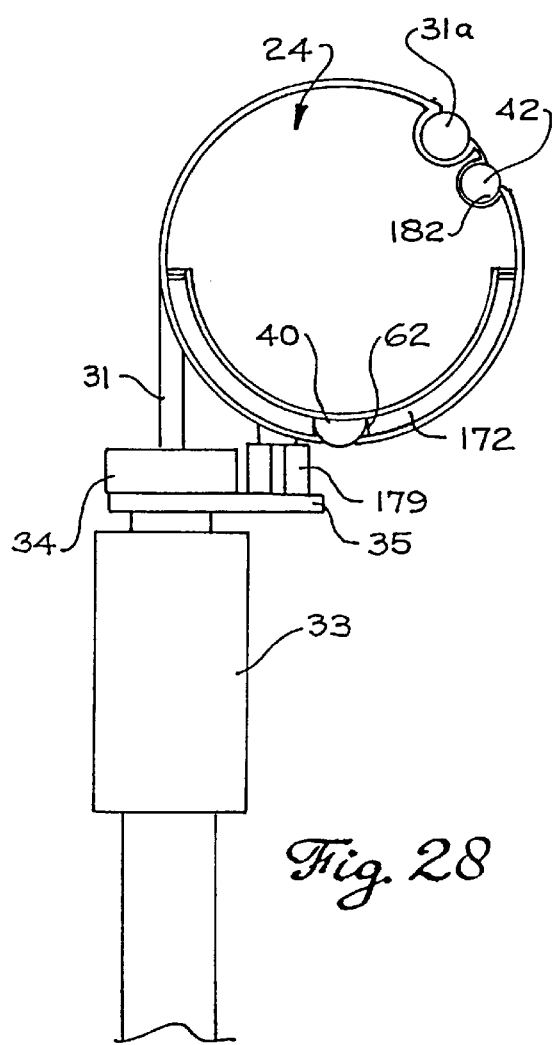
FIG. 28 is a vertical sectional view of the driver of the free-wheeling lock assembly of FIG. 1, and illustrating the return spring retainer pin engaging the driver.

With reference to FIGS. 1–2, 27 and 28, by way of illustration, the lock and key set 10 is described with reference to an application for locking a door of a motor vehicle. The drive mechanism of the free-wheeling lock assembly 12, which is formed by the cylinder 20 and the driver 24, is connected by a suitable linkage or other rotary or linear actuating mechanism, such as a cable 31, to a latching mechanism 32 associated with a door of the motor vehicle. Referring also to FIG. 28, one end 31a of the cable 31 is wrapped around the driver 24, located in a peripheral groove 156 (best shown in FIG. 27) of the driver 24 and secured to the driver 24. The cable 31 extends through a sheath 33 and has its other end 31b connected to the latching mechanism 32 that is operated by the lock. The sheath 33 is secured to the case 16 by a plate-like member 35 which engages a shoulder portion 34 of the sheath 33.

In such application, unlocking the lock requires the insertion of the proper key 14 into the lock assembly, turning the cylinder 20 in one direction, and then back to the insertion or key-out position before withdrawal of the key. Similarly, unlocking the lock requires the insertion of the proper key 14 into the lock, turning the cylinder 20 in the opposite direction, and then back to the insertion position before withdrawal of the key. The lock and key set 10 according to the invention uses a simple standard key motion to operate the lock and does not require confusing multiple motions of the key 14 to actuate the drive mechanism. While in a preferred embodiment, the lock and key set 10 is described with reference to application for a vehicle lock, the lock and key set can be used in other applications. Moreover, although the latching mechanism 32 is coupled to the lock mechanism by a cable 31 which is pulled or pushed in response to rotation of the driver 24, the latching mechanism can be coupled to the lock assembly by a lever, a rod, or any other suitable type of linkage. Also, although the latching mechanism is shown coupled to the mechanism 32 by a linkage, the latching mechanism can be directly connected to the lock assembly by coupling directly to the driver 24. One example of this would include a shaft integral to the driver 24, which extends through the back of the case 16. Another example is providing gear teeth on the periphery of the driver 24 and providing a gear driving a rod or rotary linkage.

Referring to FIG. 4, in one preferred embodiment, the key 14 is a dual cam, reversible key having a head portion 43 and a shank 44. However, conventional key and cylinder configurations can also be used. The shank 44 includes a first pattern of coded notches or cuts 45 formed in one edge 46 of the shank and a second pattern of coded notches or cuts 47 formed in the opposite edge 48 of the shank. The dual cam, reversible key 14 positively drives the tumblers 22a–22g in both upwards and downwards directions as the key 14 is being inserted into or removed from the lock.

The free-wheeling lock assembly 12 prevents damaging forces from being applied to the tumblers 22a–22g and other components of the lock assembly if the cylinder 20 is forcibly rotated by a key other than the proper key or by some other instrument. As will be described, the detent mechanism 26 (FIG. 3) includes a pair of preferably spherical elements 36 and 37, hereinafter referred to as detent balls, for coupling the case 16 to the sleeve 18 in the presence of the proper key in a keyway 21. In contrast to known detent structures of known free-wheeling locks, the detent mechanism 26 does not include a bias structure, such as a spring. The clutch mechanism 28 includes a detent ball 38 and a bias structure 39 located in a chamber defined by the forward portion of the driver 24. It will be apparent that a variety of alternate shapes can be used for the spherical elements 36 and 37 and the ball 38.

Figure 12:
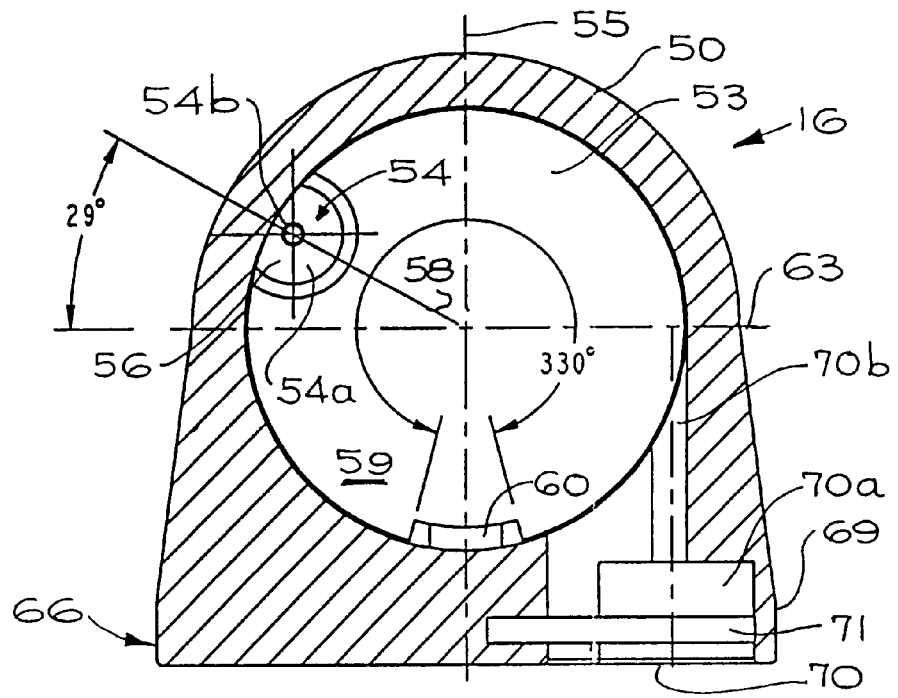
FIG. 12 is a vertical section view taken along the line 12—12 of FIG. 9.

Referring to FIGS. 4, 27–29, in accordance with the invention, under a key-out condition, the driver 24 is locked against rotation relative to the case 16 by a locking element. In one embodiment, the locking element is a pin 42 which is located in a substantially transverse groove in the periphery of the driver 24. The pin 42 has a rearward end 42a located in a recessed cam surface 54 of the case (FIG. 12). The driver 24 can be rotated by the cylinder 20 only when the proper key 14 is in the key slot 21. As will be shown, when the proper key 14 is inserted into the lock assembly, the cam surface 87 is moved by engagement with the cam element 96 (FIG. 20). Once the sleeve 18 moves axially forward, the sleeve 18 is coupled by the clutch mechanism. Rotary motion of the driver 24 forces the pin 42 out of the cam surface 54, forcing the driver pin 42 to move axially forward to follow the sleeve 18. Also, a retaining member 179 prevents the driver 24 from being moved axially relative to the case.

The cylinder lock assembly 12 further includes a locking mechanism, indicated generally at 30 in FIG. 4 and described in detail below. The locking mechanism 30 preferably includes a locking ball 40 and a spring 41 which prevents the operation of the latching mechanism 32 of the lock assembly if the cylinder 20 is slam-pulled from the case 16.

Case

Figure 10:
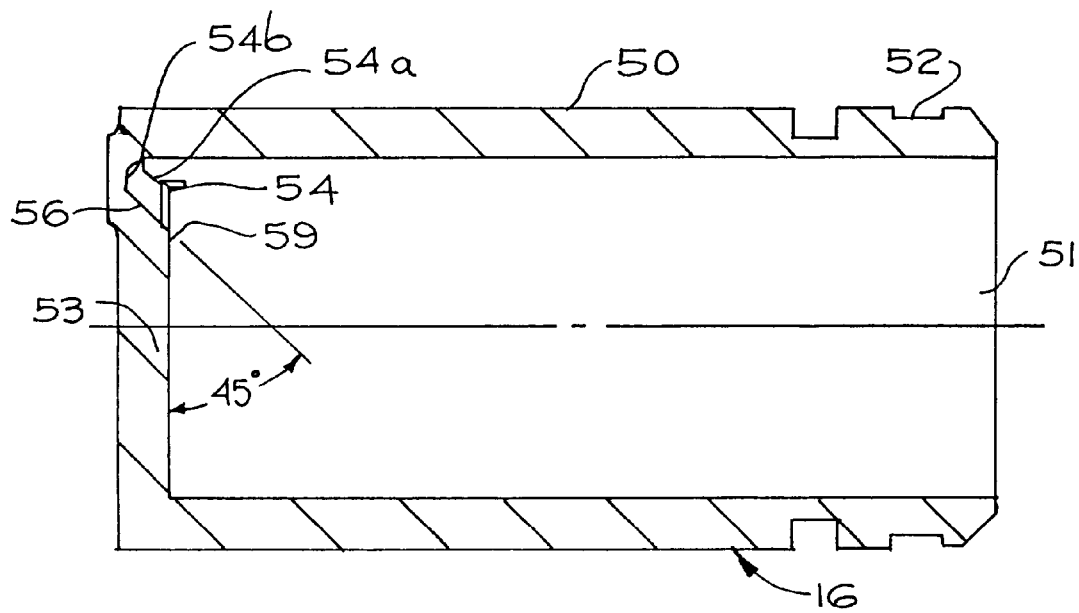
FIG. 10 is a transverse section view taken along the line 10—10 of FIG. 9.

Referring to FIGS. 8–13, the case 16 preferably comprises a hollow member including a generally cylindrical sidewall 50, having an opening 51 at its forward end 52 and a closed back wall 53. The inner surface 59 of the back wall 53 preferably includes the recessed cam surface 54, shown in FIGS. 10, 12 and 29, in the upper portion of the case, and located offset relative to a vertical centerline 55 of the case. The recessed cam surface 54 can take the shape of a truncated cone, a hemisphere or other shapes as desired. In one highly preferred embodiment, the cam surface 54 includes a curved surface 54a that slopes outwards, forwardly at an angle of approximately 45° relative to the plane of the back wall 53 of the case 16 as shown in FIG. 10. The curved surface 54a terminates in a flat center 54b which lies on a radius 58 of the case that is offset from the transverse axis 63 of the case 16 by an angular distance of approximately 29°, as shown in FIG. 12.

Figure 11:
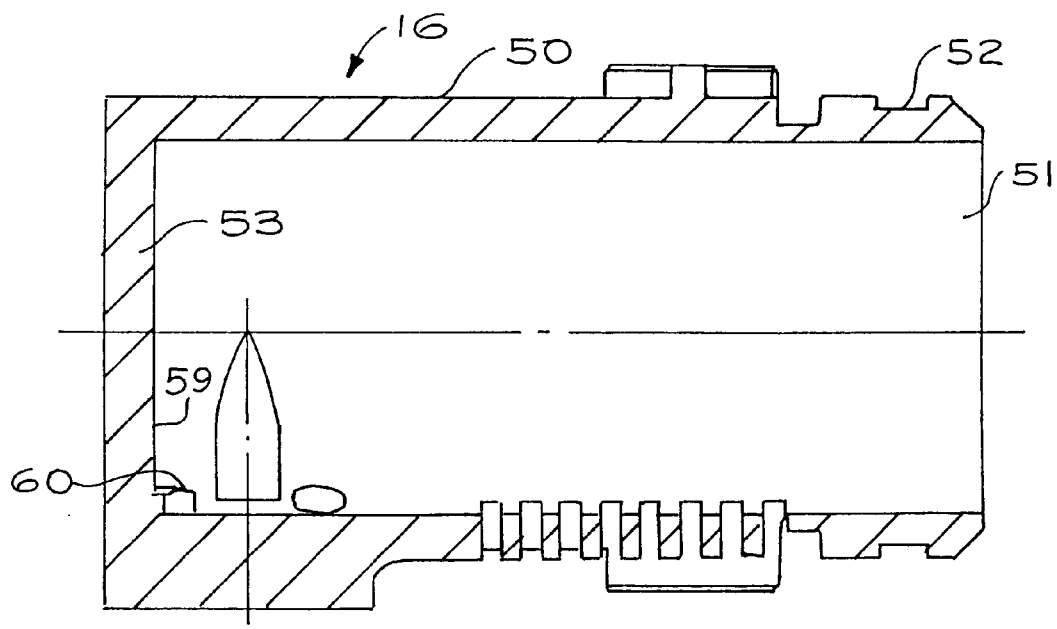
FIG. 11 is a vertical section view taken along the line 11—11 of FIG. 8.

The inner surface 59 of the case 16, at the base of the back wall 53, defines a generally C-shaped projection 60, shown in FIGS. 11 and 12, which cooperates with a similarly shaped projection 62 (FIGS. 26 and 27) of the driver 24 to form a generally cylindrically-shaped recess 64 (FIG. 6) for the locking mechanism 30.

Figure 13:
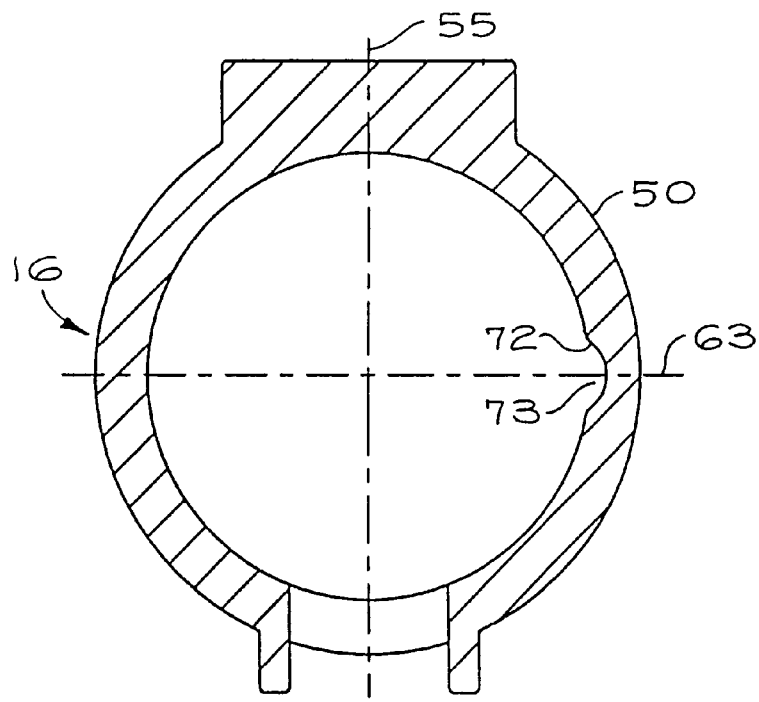
FIG. 13 is a vertical section view taken along the line 13—13 of FIG. 9.

As shown in FIGS. 3 and 13, the inner surface 72 of the case 16 at one side thereof includes an axial groove 73. The groove 73 receives the detent ball 37 for allowing axial movement of the sleeve 18 and providing a guide path for the detent ball 37 when the tumbler 22a is moved to its released position, shown in FIG. 3, for example.

The rearward portion 66 of the case 16 is generally trapezoidal in shape as viewed in FIGS. 8 and 12, for example, to facilitate connection to the cable 31 (FIG. 1). The lower rear side 69 of the case 16 defines an opening 70 to facilitate connection of the cable 31 to the driver 24. The opening 70 includes a generally rectangular region 70a which communicates with an annular channel 70b. The region 70a receives the shoulder portion 34 of the sheath 33 (FIG. 28). The rear wall 53 includes a slot 71 (FIG. 12) which is in communication with region 70a for receiving the plate-like member 35 that retains the sheath 33 in the case. The channel 70b leads from the region 70a to the peripheral groove 156 in the driver 24 (FIG. 27) to allow the upper end 31a of the cable 31 to be wrapped around the driver 24 and connected thereto.

Sleeve

Referring to FIGS. 14A, 14B, and 15–18, the sleeve 18 is a tubular member having a generally cylindrical sidewall 80 which includes openings 84 and 85 in opposing sides which function as tumbler wards for the lock assembly, The openings overlie the tumblers 22a–22g in the cylinder 20 as is shown in FIG. 4, for example. The sleeve 18 includes a further opening 86 through the sidewall 80 between the openings 84 and 85 and in which is located the detent ball 37 as shown in FIG. 3.

The sleeve 18 includes a cam surface 87 preferably formed in the inside surface 92 of the back edge 88 of the sleeve 18 and a cam follower 89 preferably projecting out forwardly from a front edge 90 at the outside surface 94 of the sleeve 18. In one embodiment, the cam surface 87 is generally triangular in shape with the base of the triangle located at or near the back edge 88 and the apex located inwardly, i.e., forwardly, of the back edge. The outer edges 87a of the cam surface 87 are each located in a plane offset approximately 25° from the transverse axis of the sleeve 18. The cam surface 87 cooperates with a cam surface 96 (FIG. 23) on the cylinder 20 to limit forward axial movement of the sleeve 18. It will be apparent that non-triangular shaped cam surfaces 87 can be used in conjunction with complementary shaped recessed cam surface 54 and cam follower 89.

The contour of the cam follower 89 at the front edge 90 of the sleeve is a mirror image of the contour of the cam surface 87 on the back edge 88 of the sleeve 18 with the base of the triangle located at or near the front edge 90 of the sleeve 18 and the apex of the triangle located forward of the front edge 90 of the sleeve 18. The cam follower 89 cooperates with a cam surface 124 (FIG. 23) on the cylinder 20 for moving the sleeve rearward axially during rotation of the cylinder 20 to its key-out position. The front edge 90 of the sleeve 18 includes a recessed annular portion 91 which receives a shoulder 120 (FIG. 20) on the front end of the cylinder 20.

Cylinder

Referring now to FIGS. 4 and 19–23, the cylinder 20 is a generally tubular element including a generally cylindrical sidewall 99 which is dimensioned to be received within the sleeve 18. The cylinder 20 includes a central portion 101, a forward portion 102 and a rearward portion 103. The front end 104 of the cylinder 20 includes an opening 100 which defines the keyway 21 for the lock. The central portion 101 of the cylinder 20 includes wards 105 which extend between the cylindrical sides 106 and 107 and which receive the tumblers 22a–22g (FIG. 4).

The forward portion 102 of the cylinder 20 preferably has an increased diameter relative to the central portion 101 of the cylinder, defining an annular shoulder 120. The front edge 121 of the annular shoulder 120 flares outwardly and includes a shallow recess 123 and a cam surface 124 (FIG. 23) projecting radially outward therefrom on one side of the cylinder. The cam surface 124 defines a cam surface which cooperates with the cam follower 89 of the sleeve 18 (FIG. 16) for driving the sleeve 18 rearwardly when the cylinder 20 returns to its key-out position under the force of the return springs (FIG. 4) or by rotation of the key 14.

The rearward portion 103 of the cylinder 20 has a reduced diameter relative to the central portion 101 of the cylinder 20, defining a shoulder 109. The portion 103 of the cylinder 20 that is located rearward includes a bore 111 which locates the ball 38 and the bias structure 39 of the clutch mechanism 28, as shown in FIG. 4. In one embodiment, the bias structure 39 comprises a compression spring as shown in FIG. 4. The back 112 of the cylinder 20 is recessed, providing an annular support surface 113 (FIG. 4) which projects from the rear of the cylinder and defines a cylindrical area 114 for receiving a hub portion 116 of the driver 24. The support surface 113 also supports the locking ball 40 (FIG. 4) for preventing locking engagement of the ball 40 with the case 16 when the cylinder 20 is mounted in the case.

Referring to FIGS. 3, 4 and 7, the cylinder wards 105 allow movement of the tumblers 22a–22g perpendicular to the axis of the cylinder 20 as the key 14 is being inserted into or removed from the lock. In one embodiment, the periphery shapes of the tumblers 22a–22g are identical to one another which simplifies manufacturing and assembly costs, for example. Each tumbler, such as tumbler 22a shown in FIG. 7, is generally rectangular in shape and has a central opening 130 therethrough. The opening 130 is defined by a pair of staggered generally rectangular windows 131 and 132 which define respective tumbler engaging surfaces 133 and 134. By staggered it is meant that one of the windows is shifted up relative to the transverse axis of the tumbler and the other window is shifted down relative to the transverse axis of the tumbler. The tumbler engaging surfaces 133 and 134 cooperate with the coded notches 45 and 47 of the dual cam key 14, FIG. 3, for activating tumblers 22a–22g both up and down during insertion or removal of the key.

Each of the tumblers 22a–22g includes a projection 135 on one side thereof which supports a resilient member 136, such as a spring or an elastomeric element as shown in FIG. 3. The resilient member 136 is located in a channel 137 defined by a shoulder 138 formed in the cylinder 20. The resilient member 136 causes all of the tumblers 22a–22g to be positioned in a down position in the key-out condition. The resilient member 136 is compressed between the shoulder 138 and the projections 135 on the tumblers 22a–22g when the tumblers 22a–22g are lifted from their down position.

The opposite side of each tumbler 22a–22g includes recessed or cut-out regions 139 which define a triangular shaped projection 140 having ramped side surfaces 140a and 140b. In one embodiment, the projection 140 on tumbler 22a, which is the last or innermost tumbler of the series of tumblers 22a–22g, moves the detent balls 36 and 37 (FIG. 3) outwardly when the projection 140 on tumbler 22a becomes vertically centered in the tumbler slots in response to the insertion of the proper key 14 into the keyway. The cylinder keyway 21 can include one or more ribs 23 which cooperate with grooves and/or recessed portions of the key shank to guide insertion of the key 14 into the lock as is known.

Driver

Figure 24:
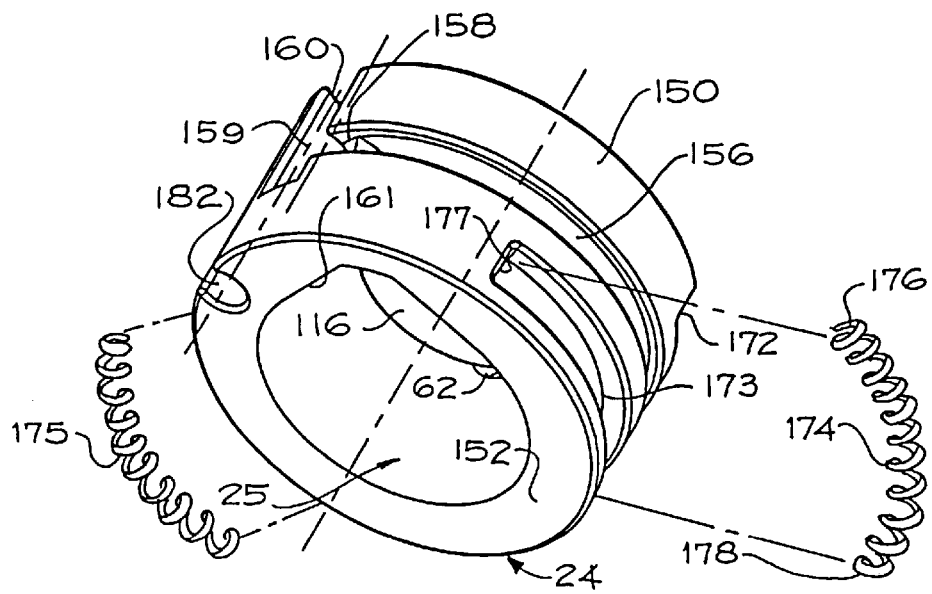
FIG. 24 is an isometric view showing the front of a driver of the free-wheeling lock assembly of FIG. 1.
Figure 25:
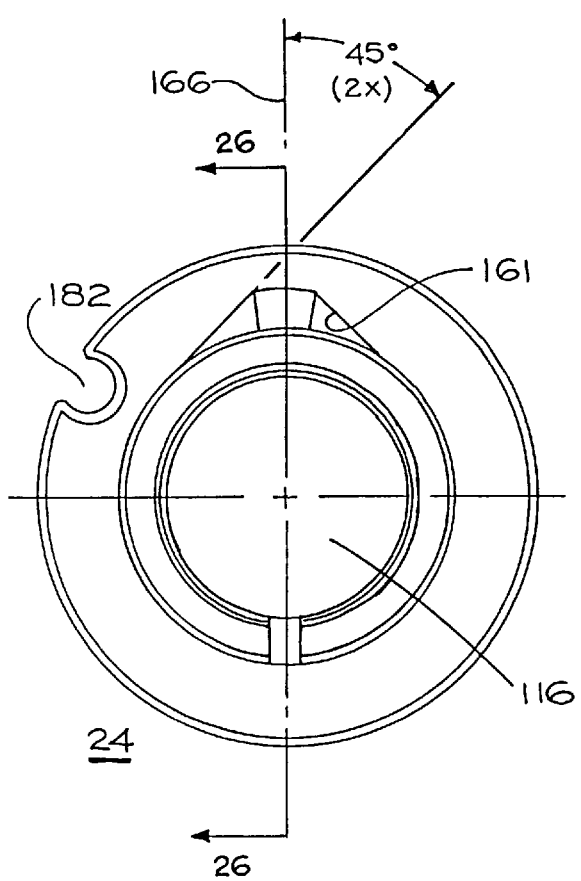
FIG. 25 is a front elevation view of the driver of FIG. 24.
Figure 26:
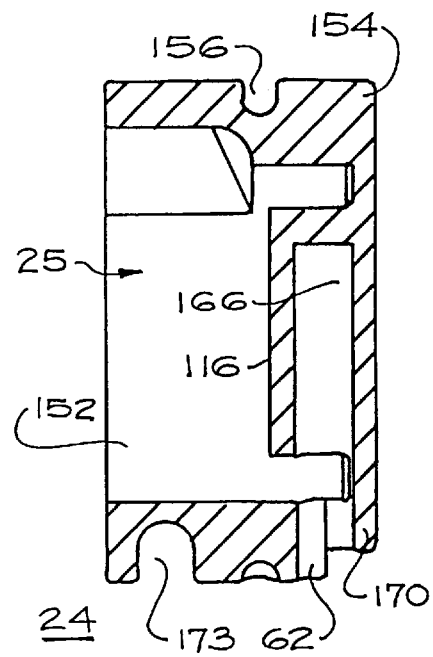
FIG. 26 is a vertical section view taken along the line 26—26 of FIG. 25.
Figure 27:
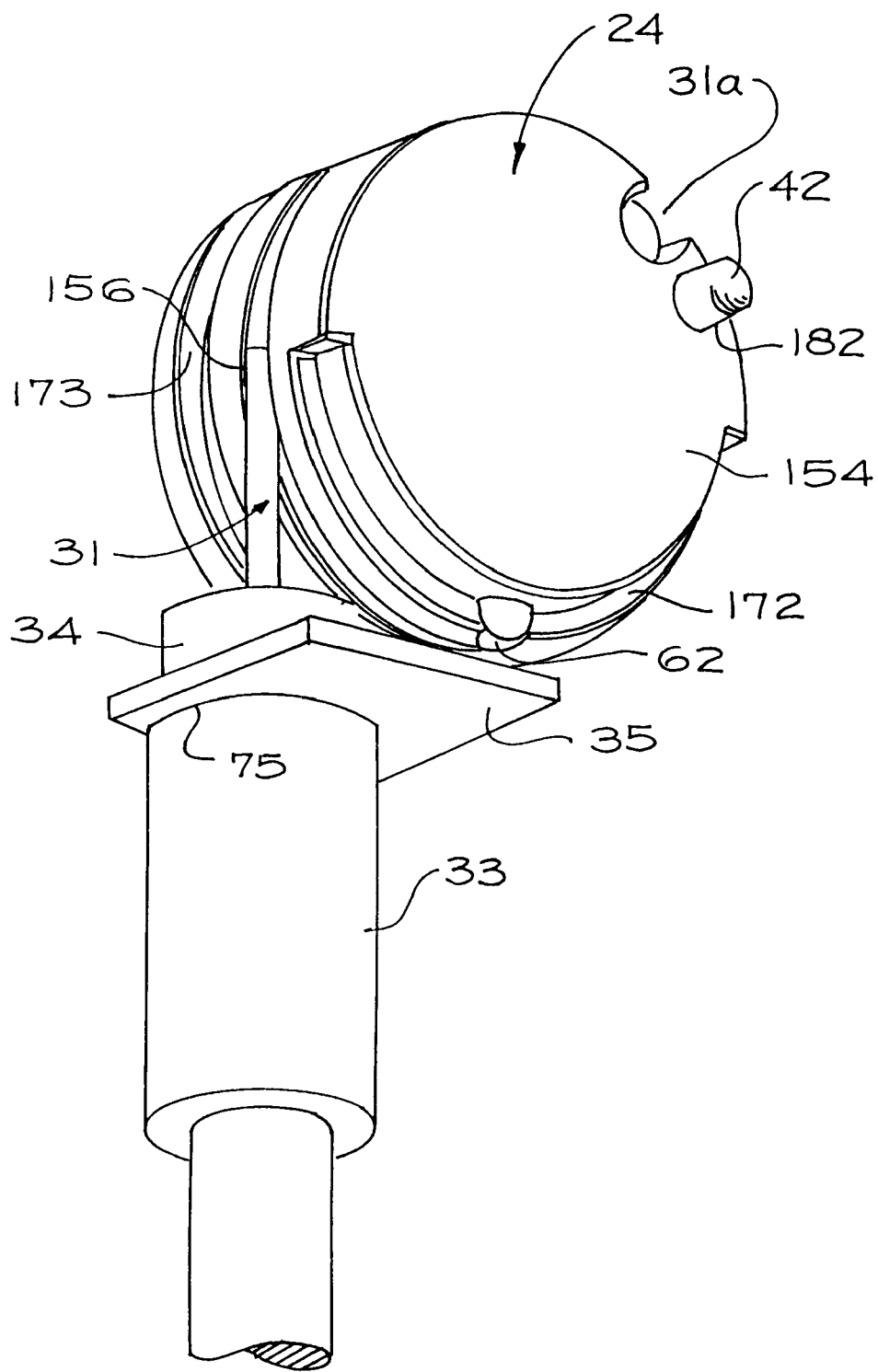
FIG. 27 is an isometric view showing the back of the driver of FIG. 24, along with a portion of the cable and sheath of the free-wheeling lock assembly of FIG. 1, and illustrating the locking ball of the anti-slam pull mechanism operated to its locking condition.

Referring to FIGS. 24–26, the driver 24 is preferably a generally annular member 150 which is open at its front end 152 and has a closed back wall 154. The driver 24 includes a peripheral groove 156 for receiving the cable 31 (FIG. 27). The groove 156, which extends over approximately one-half the circumference of the member 150, is offset toward the back wall 154 of the annular member 150. One end 158 of the groove 156 includes a transverse portion 159 defining a generally T-shaped region 160 which receives an engageably shaped end portion 31a of the cable 31. The plate 35 has a cut-out 75 which receives the shoulder 34 at the upper end of the sheath 33 as shown in FIGS. 27 and 28.

The recessed forward portion 25 of the driver 24 defines a compartment which locates the clutch mechanism 28. The open front end 152 of the driver 24 includes a generally V-shaped cam surface 161 which locates the detent ball 38 of the clutch mechanism 28, as shown in FIG. 4. In one embodiment, the V-shaped cam surface 161 slopes downward and outward at an angle of approximately 45° with respect to a vertical centerline 166 of the driver 24 as shown in FIG. 25.

Referring to FIGS. 4, 25, 26 and 27, the central hub 116 of the driver 24 is generally annular in shape and projects forwardly from the back wall 154. The hub 116 includes a downward opening radial bore 166 which locates the ball 40 and the spring 41 of the locking mechanism 30. The lower wall 170 of the driver 24, which is located beneath and aligned axially with the bore 166, defines the generally C-shaped surface 62 which cooperates with the C-shaped surface 60 of the case 16 to define a generally annular recess for receiving the locking ball 40 if the cylinder 20 should be slam-pulled from the case 16. The back wall 154 of the driver 24 includes an annular recess 172 (FIG. 27) extending over approximately one-half the circumference of the member.

Figure 6:
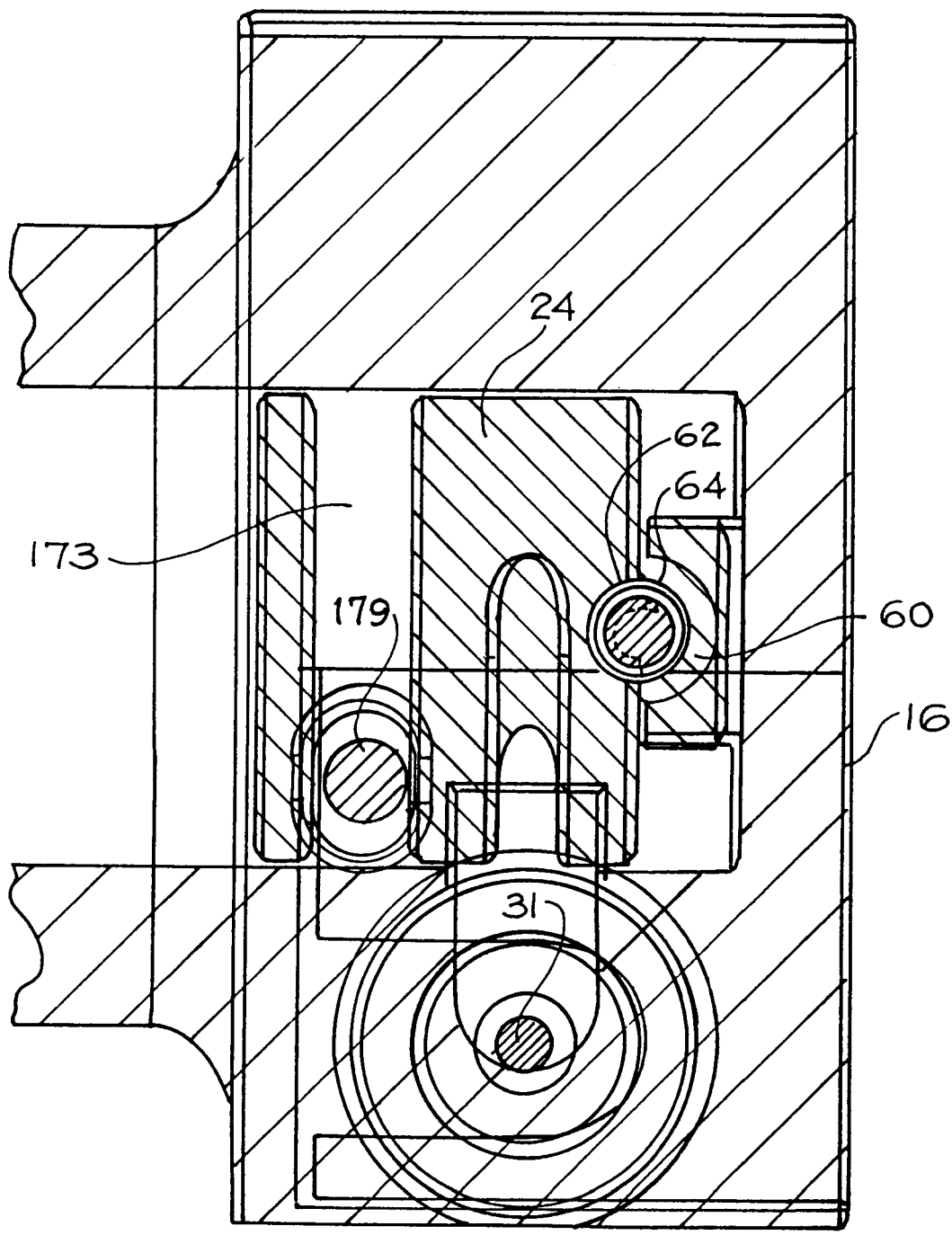
FIG. 6 is an enlarged, transverse section view of a portion of the lock and key set taken along the line 6—6 of FIG. 1.

Referring to FIGS. 4, 6 and 24, the driver 24 includes a bias structure for returning the driver 24 to its key-out position. In one embodiment, the bias structure includes a pair of coil springs 174 and 175 which are mounted in an end-to-end manner in a peripheral groove 173 in the driver 24 and held in place by a retaining member 179, which can be a pin-like member that is located between the two springs 174 and 175. The retaining pin 179 can be mounted on the plate 35 as is shown in FIG. 28, for example. The peripheral groove 173 extends over approximately one-half of the circumferential surface of the driver 24, offset toward the one side of the annular member 150. One end 176 of the coil spring 174 abuts an end surface 177 of the groove 173 and the other end 178 of the coil spring 174 engages the retaining pin 179, as shown in FIGS. 6 and 24, for example. The second spring 175 is mounted in the groove 173 on the other side of the retaining pin 179 in a similar manner. Other bias structures, including without limitation, torsion springs, can be used for returning the driver 24 to its key-out position.

Figure 29:
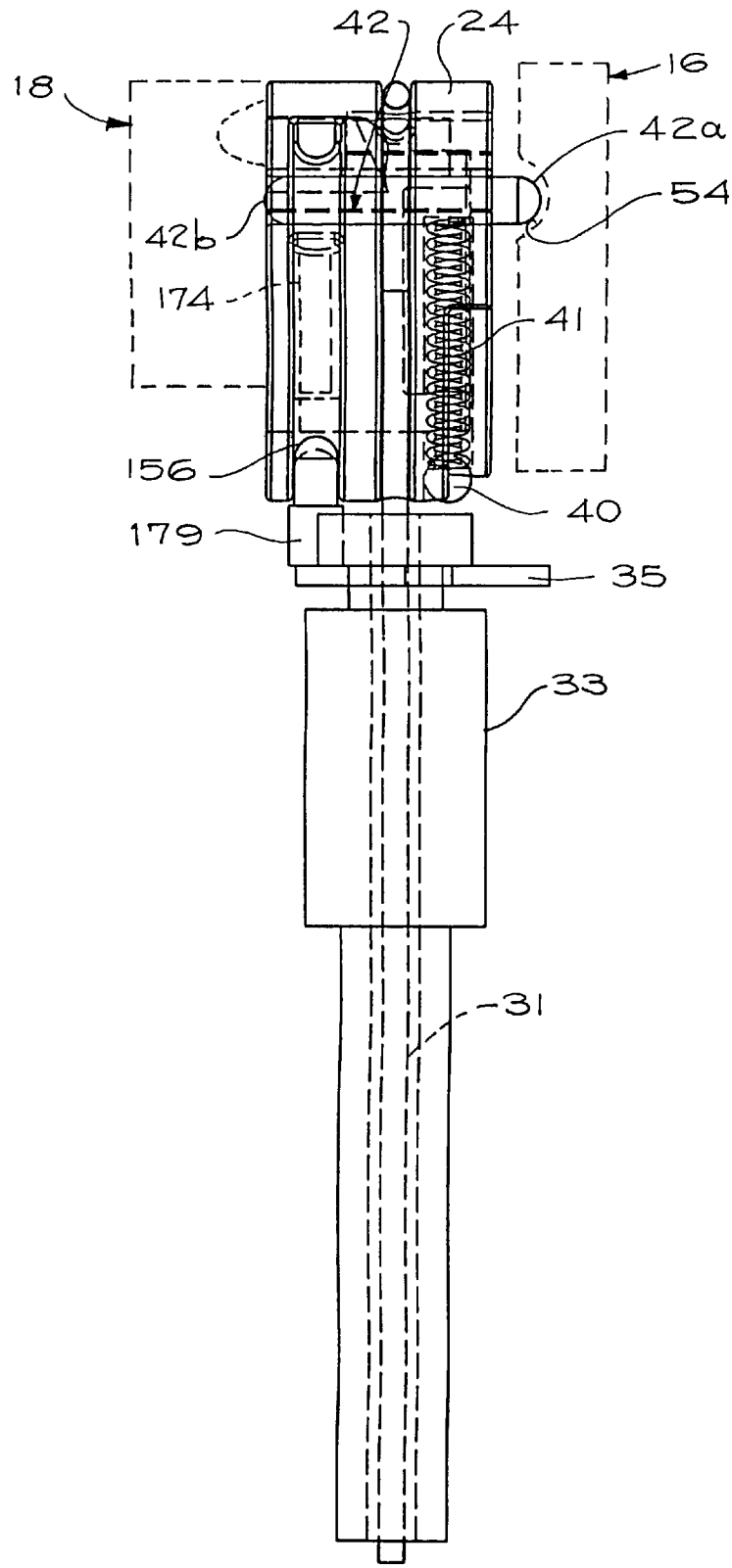
FIG. 29 is an enlarged fragmentary view illustrating mating surfaces of the case and the driver which receive a locking element of the locking mechanism of the free-wheeling lock assembly.

Referring to FIGS. 12, 25, 27 and 29, for the purposes of locking the driver 24 against rotation relative to the case 16 under a key-out condition, the peripheral wall of the driver 24 includes an axial groove 182 which receives the pin 42 as shown in FIGS. 27 and 29. The pin 42 extends in the groove 182 in the periphery of the driver 24 with its rearward end 42a located in the recessed cam surface 54 in the back wall of the case 16. The forward end 42b of the pin 42 engages the back edge of the sleeve 18. Thus, for a key-out condition, the pin 42 locks the driver 24 to the case 16. When a proper key is inserted into the keyway 21 and turned, the cylinder 20 rotates the driver 24. This causes the pin 42 to be moved axially forward, releasing the driver 24 for rotation with the cylinder 20 and moving the sleeve 18 axially forward as the pin 42 is moved forward axially. The retainer pin 179, which extends into the groove 173 in the driver 24, prevents forward axial movement of the driver 24 relative to the case 16, so that the driver 24 cannot be pulled forward.

Operation

Referring to FIGS. 1–6 and 29, in the absence of a key in the keyway 21, the tumblers 22a–22g couple the cylinder 20 to the sleeve 18 and the clutch mechanism 28 couples the cylinder 20 to the driver 24. The cylinder 20 and the sleeve 18 are free to rotate with respect to the case 16 at this point. The cylinder 20 is linked to the driver 24 by the clutch mechanism 28 which connects the cylinder 20 to the driver 24 in a rotary fashion up to the torque limit. The driver 24 is held against rotation by the pin 42, the back end 42a of which engages the recessed cam surface 54 in the rear wall 53 of the case 16. The latching mechanism connected to the driver 24 by the cable 31 is prevented from moving by the locking action of the pin 42 on the driver 24.

For a key-out condition, the recesses 139 in the tumbler 20a allow the detent balls 36 and 37 to be driven inward if the cylinder 20 is rotated. The tumblers 22a–22g project into the openings in the sleeve for preventing relative rotary motion between the cylinder 20 and sleeve 18 because the resilient member 136 urges the tumblers 22a–22g to the key-out position.

When the proper key 14 is inserted into the keyway 21, the tumblers 22a–22g are drawn into the cylinder 20, disengaging the cylinder 20 from the sleeve 18. When the key 14 moves the last tumbler 22a, the projection 140 on the tumbler 22a forces the detent balls 36 and 37 outward radially such that the parting or shear line 142 between the two detent balls 36 and 37 becomes aligned with the circumferential interface 144 between the sleeve 18 and the cylinder 20 as shown in FIG. 3. This allows the cylinder 20 to be rotated relative to the sleeve 18. In addition, the outermost detent ball 37 is driven into engagement with the recess 73 provided in the inner surface 59 of the case 16, thereby coupling the sleeve 18 to the case 16 to prevent relative rotation between the sleeve 18 and the case 16. However, the sleeve 18 can move axially within the cylinder 20.

Turning of the key 14 in the keyway 21, in either direction, rotates the cylinder 20 which, in turn, rotates the driver 24 which is coupled to the cylinder 20 by the clutch mechanism 28. Referring also to FIG. 29, the relative rotary motion between the cylinder 20 and sleeve 18 also results in an axial motion of the sleeve 18 with respect to the cylinder 20. As the driver 24 is rotated by the cylinder 20, the end 42a of the pin 42 rides up the ramped cam surface 54 in the back wall 53 of the case 16, so that the pin 42 is translated or moved forward axially. As the pin 42 moves forward, the sleeve 18 is simultaneously cammed forward by the cam surface 87.

Once the sleeve 18 begins to move axially forward, the pin 42 is also free to move axially forward in the driver 24. Simultaneously, the rotation of the cylinder 20 causes the driver 24 to rotate due to the coupling action of the detent ball 38 and the spring 39 of the clutch mechanism 28. As the driver 24 rotates, the back end 42a of the pin 42 is moved forwardly out of the recessed cam surface 54 in the rear wall 53 of the case 16, releasing the driver 24. Releasing the driver 24 from the case 16, allows the driver 24 to continue to rotate with the cylinder 20.

Because the contours of the three cam surfaces 54, 87 and 89 substantially are the same, the pin 42 is moved forward, while supported in the groove in the driver 24. The sleeve 18 follows the axial motion of the pin 42 which is being rotated along with the driver 24 as the pin 42 is being translated forwardly. As the driver 24 is rotated, one of the return springs is compressed within the groove 173. Also, the cable 31 is pushed or pulled, depending upon the direction of rotation of the cylinder 20, to lock or unlock the mechanism 32. This rotating and camming action continues until the driver 24 reaches the end of its rotary limit in the case 16 defined by the annular groove 173 and the retaining pin 179. It is apparent that if the driver 24 remains locked to the case 16, torque applied between the cylinder 20 and the driver 24 will cause the clutch mechanism 28 to decouple the driver 24 from the cylinder 20.

Referring to FIGS. 6, 24 and 29, when torque on the key 14 is released, the lock is returned to the key-out position by the return spring which rotates the cylinder 20, and the key 14 therein, back to their key-out positions. As the cylinder 20 rotates, the cam pin 124 on the cylinder 20 is moved into engagement with the cam follower 89 on the forward end of the sleeve 18 and moves the sleeve 18 axially towards the rear of the case 16. The sleeve 18, in turn, pushes the pin 42 towards the rear of the case 16 and back into the recessed cam surface 54 in the surface 59 of the back wall 53 of the case 16. Simultaneously, the rotation of the cylinder 20 rotates the driver 24 back to its key-out position which aligns the pin 42 with the recessed cam surface 54 in the back wall of the case 16. When the pin 42 is fully seated in the recessed cam surface 54 and the sleeve 18 is in its rearmost or key-out position, the tumblers 22a–22g are aligned to engage one of the openings 84 and 85 in the sleeve 18 when the key 14 is removed. When the key 14 is removed, the tumblers 22a–22g are restored to the key-out position by the resilient member 136.

If an improper key or other instrument, such as a screwdriver, is inserted into the keyway 21 and an attempt is made to rotate the cylinder 20, the cylinder 20 is locked to the sleeve 18 by the tumblers 22a–22g. Because the tumblers 22a–22g are not retracted into the slots 105 of the cylinder 20 the detent balls 36 and 37 are free to move and are driven inward radially by the camming action of the groove 73 in the case on the detent ball 37 as the cylinder 20 is rotated. Accordingly, the sleeve 18 rotates as a unit with the cylinder 20 relative to the case 16. Moreover, the driver 24 is locked to the case by the pin 42, holding the driver 24 against rotation relative to the case so that the lock can not be operated. Also, because the driver 24 is locked to the case 16, the sleeve 18 is held against axial movement.

If sufficient torque is applied to the cylinder 20, the clutch mechanism 28 releases the driver 24 from the cylinder 20. That is, the ball 38 is cammed down by the V-shaped detent notch 161 into the bore 111 in the cylinder against the force of the spring 39, compressing the spring. Consequently, the ball 38 is moved out of engagement with the surface of the driver 24. Once the spring biased ball 38 of the clutch mechanism 28 is moved out of engagement with the driver, the cylinder 20 can rotate without causing motion of the driver 24.

Any forced rotary motion of the cylinder 20 will cause the detent ball 38 to be cammed out of the V-shaped detent notch 161 in the driver 24, allowing the cylinder 20 to rotate independently of the driver 24. The torque required on the cylinder 20 to initiate this condition is determined by the stiffness of the detent spring 39 and is set to a level much higher than is normally required to operate a locking mechanism. Once the lock cylinder 20 is free-wheeling, the lock cylinder can be reset by rotating the cylinder 20 back to its key-out position relative to the driver 24. The detent ball 38 engages the detent notch in the driver 24, resetting the lock assembly.

However, if the cylinder is slam-pulled from the case 16, as the cylinder 20 is pulled out, with or without the sleeve 18, the support ledge provided by rearwardly projecting surface 113 (FIG. 4) of the cylinder 20 is removed from beneath the locking ball 40. This allows the locking ball 40 to drop down under the force of gravity and the force of the spring 41, into the annular recess 64 formed by the mating C-shaped surfaces 60 and 62 of the case 16 and the driver 24. This locks the driver 24 to the case 16, preventing the driver 24 from being rotated with respect to the case 16. Consequently, the lock is rendered inoperative. Thus, the locking mechanism 30 substantially prevents manipulation of the lock after a slam-pull attack. In addition, because the locking ball 40 is hidden in the rearward portion of the driver at the lower rear end of the case 16, and because of the small access hole to the locking ball 40 and the spring 41, this construction prevents the attacker from removing the ball 40 and freeing the driver 24.

An additional benefit of this new design for a lock that includes a free-wheeling mechanism is its ability to resist picking. Most locks can be picked when the cylinder 20 is rotated with respect to the tumbler wards. This allows a tumbler to be "loaded" or to contact the edge of the sleeve tumbler ward. When the tumblers 22a–22g are held in this manner, the tumblers 22a–22g can be individually picked down out of the ward until the cylinder 20 rotates freely. In accordance with the invention, the tumbler wards are contained in the sleeve 18 which is free to rotate with the cylinder 20. If an attacker attempts to rotate the cylinder 20 to load a tumbler, the sleeve 18 rotates freely along and hence no load can be placed on the edge of the tumblers 22a–22g because the tumblers are "floating" with respect to the case 16. Although some known free-wheeling locks also have a sleeve 18 which rotates with respect to the cylinder 20, typically such locks include a detent ball mechanism which holds the sleeve 18 in the key-out position. This detent mechanism allows enough drag on the sleeve 18 to permit an attacker to load the tumblers 22a–22g and permits picking.

While preferred embodiments have been illustrated and described, it should be understood that changes and modifications can be made thereto without departing from the invention in its broadest aspects. Various features of the invention are defined in the following claims.

What is claimed is:

1. A lock assembly for controlling a latching mechanism, the lock assembly comprising:

a case;

a sleeve mounted within the case for axial movement relative to the case;

a cylinder mounted within the sleeve for substantially rotational movement relative to the case and the sleeve, the cylinder having a keyway and at least one tumbler located to be operated to a release position in response to insertion of a key into the keyway;

a driver mounted within the case for rotational movement relative to the case;

a locking mechanism disposed between the case and the driver for locking the driver to the case to prevent relative rotational movement between the driver and the case for a key-out condition for the lock assembly, the sleeve being adapted for movement substantially axial relative to the cylinder to allow the locking mechanism to be released and allow rotational movement of the driver only when a proper key is in the keyway; and a translation mechanism for driving the sleeve axially in a first direction when the cylinder is rotated away from a first position and for driving the sleeve axially in a second direction that is opposite to the first direction when the cylinder is returned to said first position, and a clutch mechanism for coupling the driver to the cylinder, the clutch mechanism including a generally V-shaped surface in the driver, a detent ball located within the generally V-shaped surface of the driver, and a bias structure for biasing the detent ball into engagement with the V-shaped surface, the bias structure being selected to produce a force that exceeds a break torque required to decouple the driver from the cylinder, allowing the detent ball to be cammed out when the break torque is exceeded.

2. The A lock assembly for controlling a latching mechanism, the lock assembly comprising:

a case;

a cylinder mounted within the case;

a driver coupled to the cylinder; and a slam-pull protection mechanism, including a locking element cooperating with the cylinder to be maintained in a first position when the cylinder is in the case, the locking element being moved away from the first position to a second position to lock the driver to the case in response to the removal of the cylinder from the case, wherein the locking element is carried by the driver, and wherein the slam pull mechanism includes a bias structure for biasing the locking element into engagement with a blocking surface of the cylinder.

3. The lock assembly according to claim 2, including a bias mechanism for returning the cylinder to a key-out position in response to the release of torque on the key, the bias mechanism including a retaining pin for cooperating with the driver to prevent axial movement of the driver relative to the case.

4. The A lock assembly for controlling a latching mechanism, the lock assembly comprising:

a case;

a cylinder mounted within the case;

a driver coupled to the cylinder; and a slam-pull protection mechanism, including a locking element cooperating with the cylinder to be maintained in a first position when the cylinder is in the case, the locking element being moved away from the first position to a second position to lock the driver to the case in response to the removal of the cylinder from the case, wherein the case and the driver cooperate to define a recess, the locking element being moved into the recess in response to the removal of the cylinder from the case.

5. The lock assembly according to claim 4, wherein the blocking surface of the cylinder is interposed between the locking element and the recess for preventing the locking element from being moved into the recess when the cylinder is located in the case, and wherein the blocking surface is configured to allow relative motion between the blocking surface and the locking element while preventing the locking element from being moved into the recess when the cylinder is rotated under a free-wheeling condition.

6. The lock assembly according to claim 4, wherein the case defines a first generally C-shaped surface portion of the recess and the driver defines a second generally C-shaped surface portion of the recess, the second surface portion of the driver being located adjacent to the first surface portion of the case when the driver is in a key-out position.

* * * * *